July 21, 1959 HUNG CHANG LIN 2,896,029

SEMICONDUCTOR AMPLIFIER CIRCUITS

Filed May 3, 1955

INVENTOR.
Hung Chang Lin
BY H. W. Newton
ATTORNEY.

United States Patent Office 2,896,029

Patented July 21, 1959

2,896,029

SEMICONDUCTOR AMPLIFIER CIRCUITS

Hung Chang Lin, Levittown, Pa., assignor to Radio Corporation of America, a corporation of Delaware Application May 3, 1955, Serial No. 505,769

6 Claims. (Cl. 179—171)

Figure 1:
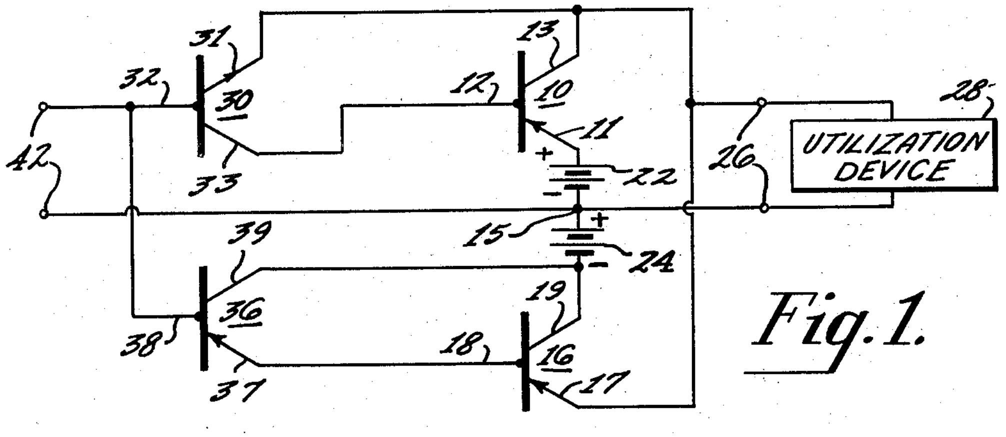

This invention relates generally to signal amplifier circuits, and more particularly relates to signal amplifier circuits wherein semiconductor devices or transistors are utilized as the amplifying or signal translating elements.

Radio and television receivers require circuits which are reliable, economical and simple in operation. Particularly effective use may be made of transistors in amplifier applications for the audio circuits of the aforementioned receiver equipment. In such applications, low distortion, wide frequency range and relatively high power output are highly desirable. Push-pull operation of amplifier circuits contributes to low distortion, and wide frequency range may be more easily obtained with this mode of operation. Elimination of the speaker coupling or output transformer also contributes materially to improvement in quality and low cost of manufacture. Class B operation may contribute to high output power at low cost. Heretofore, these desirable features have been obtained with some degree of circuit complexity and by the use of more costly components, as well as careful selection of matched amplification devices in push-pull circuit arrangements.

It is an object of the present invention, therefore, to provide an improved and simplified amplifier circuit in which semiconductor devices are effectively utilized to provide the aforementioned advantages of low distortion, wide frequency range and high power output.

It is a further object of the invention to provide an improved semiconductor audio frequency signal amplifier circuit in which the requirement for output coupling transformers is eliminated.

It is a still further object of the invention, to provide an improved semiconductor amplifier circuit wherein Class B operation may be utilized to provide high power output in an efficient manner.

It is another object of the invention, to provide an improved transistor amplifier circuit to provide push-pull signal amplification in a single-ended circuit whereby low distortion is achieved.

It is still another object of the invention, to provide a push-pull single-ended transistor signal amplifier circuit having an improved driving means whereby the advantages of push-pull operation may be obtained economically.

It is another object of the invention, to provide an improved push-pull single-ended transistor amplifier circuit employing transistors of like conductivity type in its output circuit, whereby selection of power transistors having characteristics suitable for push-pull signal amplification is facilitated.

It is yet another object of the invention, to provide an improved amplifier circuit employing transistors to effectively provide amplification of direct current signals in a simple but reliable circuit configuration.

Further objects and advantages of circuits embodying the invention will become apparent from the description contained hereinafter.

A signal amplifier circuit, in accordance with the invention, comprises a pair of semiconductor devices, such as transistors, of like conductivity type connected in a push-pull power amplifier output stage and arranged in parallel relation for supplying signal currents to a utilization device. This connection is known as a push-pull single-ended circuit. A pair of transistors of opposite conductivity types are connected in driving relation with the output stage and provide the required out-of-phase signals to the output stage. Input electrodes of the pair of transistors of opposite conductivity type are coupled in common to a source of input signals which are to be amplified.

The driver stage thus provides out-of-phase driving signals, in response to a single-ended input signal, to a pair of power output transistors of like conductivity type.

In a preferred arrangement, operating potentials are applied to the driver transistors by a direct coupling connection between each driver transistor and its respective power transistor. Thus, the collector-emitter path of each driver transistor may be connected across the collector and base electrodes of the power transistor to which it is to supply driving currents. In this preferred arrangement no coupling components are required between the driver and power transistors. The collector-emitter paths of the driver transistors must be oriented in order to provide out-of-phase signals to the power output stage transistors.

Figure 2:
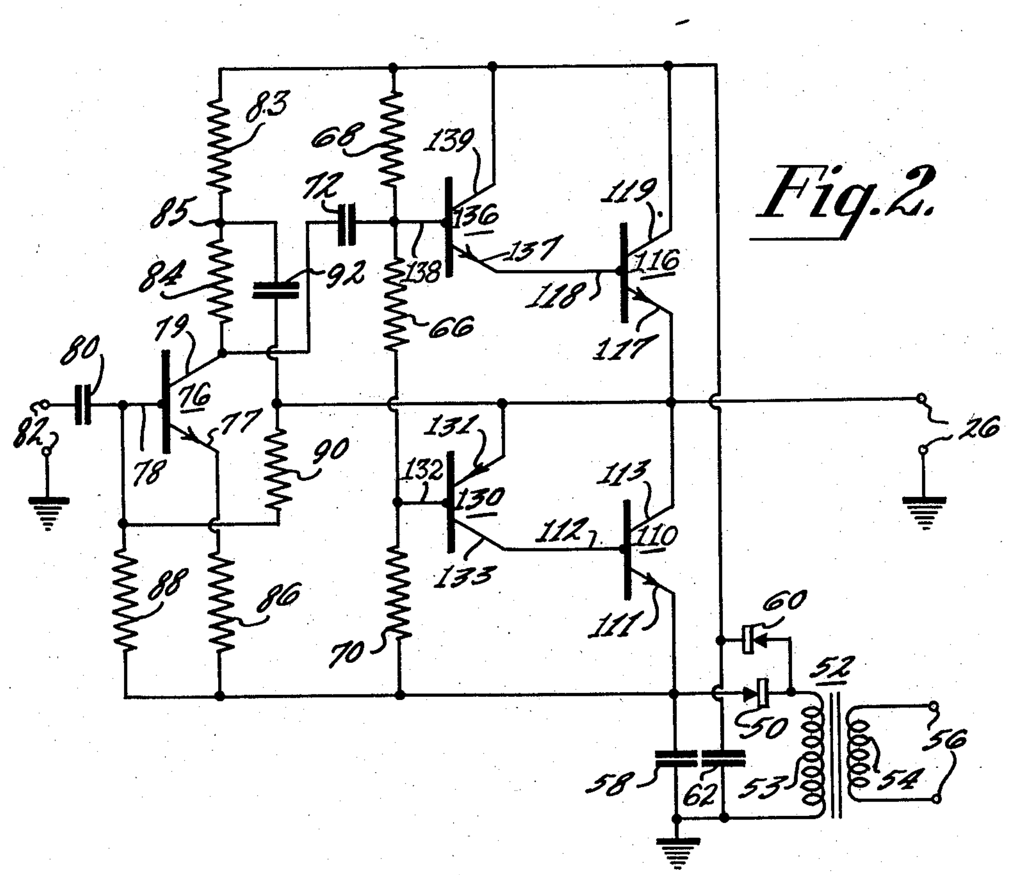

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a signal amplifier circuit utilizing a pair of transistors of like conductivity type in a power output stage driven by a pair of transistors of opposite conductivity type, in accordance with the invention, and Figure 2 is a schematic circuit diagram of an amplifier circuit illustrating, in a further embodiment of the invention, a method of applying bias to the transistors.

Referring now to the drawing, wherein like elements are designated by like reference numerals in both figures, and referring particularly to Figure 1, a pair of transistors 10 and 16, of like conductivity types, and shown for illustrative purposes to be of the P-N-P junction type, include respectively a pair of emitter electrodes 11 and 17, a pair of base electrodes 12 and 18, and a pair of collector electrodes 13 and 19. The emitter electrode 11 of the transistor 10 is connected through a source of energizing potential illustrated as a battery 22 to a point of reference potential 15. The collector electrode 19 of the transistor 16 is likewise connected through a battery 24 to the point of reference potential 15. The collector electrode 13 and the emitter electrode 17 of the transistors 10 and 16 respectively are connected in common with one of a pair of output terminals 26, the other of which is connected to the point of reference potential 15. A utilization device 28, which may be a loudspeaker of the conventional moving coil type for example, may be connected to the pair of output terminals 26.

The transistors 10 and 16 are connected in parallel relation with respect to the utilization device 28, and are connected in series with respect to the batteries 22 and 24. Push-pull operation is thereby effected by supplying out-of-phase input signals to the base electrodes 12 and 18 of the transistors 10 and 16 respectively. To this end, a pair of transistors 30 and 36 of opposite conductivity type, including respectively a pair of emitter electrodes 31 and 37, a pair of base electrodes 32 and 38, and a pair of collector electrodes 33 and 39, are connected in driving relation with the pair of output stage transistors 10 and 16.

The collector electrode 33 and the emitter electrode 31 of the transistor 30 are directly connected, respectively, to the base electrode 12 and the collector electrode 13 of the output transistor 10, while the emitter electrode 37 and the collector electrode 39 of the transistor 36 are directly connected, respectively, to the base electrode 18 and the collector electrode 19 of the transistor 16. The direct voltage existing between the base and collector electrodes of the output stage transistors 10 and 16 are thereby utilized as energizing voltages for the collector-emitter paths of the driver transistors 30 and 36.

The base electrodes 32 and 38 may be connected in common to one of a pair of input terminals 42, the other of which is connected to the point of reference potential 15.

Connected in this manner, the circuit of Figure 1, operates in Class B, thus providing high efficiency in a circuit utilizing no components other than the transistors themselves and the batteries.

During a positive half cycle of an input signal applied at the pair of input terminals 42, the transistors 36 and 16 are cut-off, while the transistor 30 conducts. A current is thereby drawn from the base electrode 12 causing the transistor 10 to conduct. A signal current then flows from the battery 22 through the emitter and collector electrodes 11 and 13, through the utilization device 28, and back to the battery 22. During a negative half cycle of input signal, on the other hand, the transistors 30 and 10 are cut-off and a current flows out of the base electrode 38 causing an amplified current to flow into the emitter electrode 37 from the base electrode 18 of the transistor 16, thereby causing the collector-emitter path of the transistor 16 to conduct. Thus, current flows from the positive terminal of the battery 24 through the utilization device and the collector-emitter path of the transistor 16 back to the negative terminal of the battery 24.

The transistor 30 provides a phase inverting path between the pair of input terminals 42 and the base electrode 12, while the transistor 36 provides no such phase reversal between the pair of input terminals 42 and the base electrode 18. Thus, signal currents in a single-ended input circuit are changed by the transistors 30 and 36 to out-of-phase signal currents suitable for driving a pair of transistors of like conductivity type connected in a push-pull single-ended output circuit.

By virtue of the fact that no reactive coupling elements are shown or required in this circuit, the frequency response need depend only upon that of the transistors themselves. Since the transistors are each effectively utilized in a negative feedback connection (i.e. common collector configuration) the high frequency response is excellent. The low frequency response extends to direct current, since no reactive coupling elements are utilized.

The distortion encountered in use of this circuit is very low because of the aforementioned feedback.

Output power may be high, and with high efficiency since the transistors operate in Class B. Furthermore, optimum load impedance requirements may be met by the use of a loudspeaker of normally low impedance, so that direct coupling of a loudspeaker may be employed while eliminating the need for a costly speaker coupling transformer.

Referring now to Figure 2, a first pair of transistors 110 and 116 are shown for illustrative purposes to be of the N-P-N junction type. The transistor 110 includes an emitter electrode 111, a base electrode 112, and a collector electrode 113, while the transistor 116 includes an emitter electrode 117, a base electrode 118, and a collector electrode 119. The emitter electrode 117 is connected directly to the collector electrode 113. The emitter electrode 111 is connected to a negative source of energizing potential which is shown for illustrative purposes to include a rectifier 50 connected to the secondary winding 53 of a transformer 52, the primary winding 54 of which may be coupled to the power line through a pair of terminals 56. Filtering of this supply is accomplished by a filtering capacitor 58. The collector electrode 119 of the transistor 116 is coupled to a positive source of supply consisting of a rectifier diode 60 coupled to the secondary winding 53, and a filtering capacitor 62 connected between the collector electrode 119 and circuit ground. Output signals may be derived from the amplifier circuit from a pair of output terminals 26, one of which is connected to ground, and the other of which is connected in common to the emitter electrode 117 and the collector electrode 113.

A second pair of transistors 130 and 136 of opposite conductivity type are connected in driving relation with the transistors 110 and 116 and are connected to require a single-ended source of signals. The transistor 130, of the P-N-P type, includes an emitter electrode 131, a base electrode 132, and a collector electrode 133. The collector electrode 133 is connected directly to the base electrode 112 to provide signal currents thereto. The emitter electrode 131 is connected to the ungrounded one of the pair of output terminals 126.

The transistor 136 includes an emitter electrode 137, a base electrode 138, and a collector electrode 139. The emitter electrode 137 is connected to the base electrode 118 for providing signals current thereto and the collector 139 is connected to the positive source of supply. The base electrode 138 is connected through a biasing resistor 66 to the base electrode 132. Biasing voltages for the base electrodes 138 and 132 are developed across the resistor 66 by means of a current derived from the positive and negative supplies through a resistor 68, coupled between the positive supply and the base electrode 138, and a resistor 70 connected between the negative supply and the base electrode 132.

The resistor 66 may be replaced by a thermistor or some other temperature responsive resistance in order to provide variation of the bias with temperature depending upon the requirements of the transistors 110, 116, 130, and 136. Depending upon the bias applied to the base electrodes 132 and 138, the circuit including both the output stage and the driver stage may be operated in either Class A or Class B or at a point intermediate these two classes of operation. Additionally, Class C operation, useful in certain radio frequency amplifier applications, may be utilized by providing reverse bias for the base electrodes 132 and 138.

Signals applied to the base electrodes 138 and 132, as for example, through the coupling capacitor 72 will be amplified and will appear at the pair of output terminals 26 where they may be utilized to directly drive a loudspeaker or any other device. A third amplifier stage comprises a transistor 76 having an emitter electrode 77, a base electrode 78 and a collector electrode 79. The base electrode 78 is coupled through a coupling capacitor 80 to one of a pair of input terminals 82, the other of which is connected to ground. Energizing current is supplied to the collector electrode 79 by means of resistors 83 and 84 connected between the positive supply and the collector electrode 139. Signals are coupled from the collector electrode 79 through the coupling capacitor 72 to the base electrodes 138 and 132. The direct current operation of the transistor 76 is stabilized by the connection of a stabilizing resistor 86 between the emitter electrode 77 and the negative supply source. The base electrode 78 is returned to the negative supply source through a resistor 88 connected therebetween. Bias current is supplied to the base electrode 78 by a feedback resistor 90 connected between the base electrode 78 and the ungrounded one of the pair of output terminals 26. The feedback resistor 90 provides negative feedback for the operation of the entire amplifier. If this negative feedback is not desired the resistor 90 could be connected between the base electrode 78 and ground. In order to raise the gain of the amplifier circuit and to provide a greater output signal capability of the driver transistor 76, an output signal is fed back to the tap 85 from the ungrounded one of the output terminals 26 through a feedback capacitor 92. This feature provides greater output current capability of the transistor 76 since it reduces signal current flowing through the resistor 84 from the collector electrode 79 and therefore makes more signal current available for the base electrodes 38 and 32. The transistor 76 is shown for illustrative purposes to be an N-P-N transistor. A P-N-P transistor may be utilized equally well in this application by returning the emitter electrode 77 to the positive supply and the collector electrode 79 to the negative supply.

Operation of the transistors 110, 116, 130 and 136 is similar to the circuit operation described with reference to Figure 1, except that bias voltage is applied to the base electrodes 138 and 132 in order to adjust the operating point to give any desired class of operation.

Amplifier circuits in accordance with the invention may provide high fidelity amplification of input signals to a loudspeaker coupled directly to the output terminals.

An output transformer is not required because of the low load impedances which may be coupled to transistors and because of the parallel connection of the two output circuit transistors. Direct current amplification may be provided since no reactive coupling elements are required and relatively large amounts of feedback may be applied to the circuit, since phase shift of signals in an output transformer is not encountered.

An amplifier circuit in accordance with the invention utilizes push-pull single-ended operation to provide low distortion, wide frequency range and high power output, in an economical and efficient manner. Selection of output transistors is facilitated by virtue of the fact that transistors of like conductivity types are utilized.

What is claimed is:

1. In a push-pull amplifier circuit the combination with a first transistor of one conductivity type including a first base, a first emitter, and a first collector electrode; a second transistor of said one conductivity type including a second base, a second emitter, and a second collector electrode; means connecting said first emitter electrode with said second collector electrode; and output circuit means connected with said first collector and second emitter electrodes and to a common point in said circuit to derive a push-pull output signal; of a third transistor of an opposite conductivity type including a third base, a third emitter, and a third collector electrode; a fourth transistor of said one conductivity type including a fourth base, a fourth emitter, and a fourth collector electrode; input circuit means connected with said third and fourth base electrodes and to a common point in said circuit for applying an input signal thereto; signal conveying and direct-current conductive means connecting said third collector electrode with said first base electrode; means connecting said third emitter electrode with said first collector electrode; signal conveying and direct-current conductive means connecting said fourth emitter electrode with said second base electrode; and means connecting said fourth collector electrode with said second collector electrode; said third and fourth transistors being alternately conductive in response to input signals of opposite polarity to provide out-of-phase signals for driving said first and second transistors in push-pull relation.

2. A push-pull signal amplifier circuit comprising, in combination, a first and a second output transistor of one conductivity type each including base, emitter, and collector electrodes, means providing a series direct-current conductive path for applying energizing potentials to said output transistors, said direct-current conductive path including a direct-current conductive connection between the emitter of said first transistor and the collector of said second transistor, output circuit means connected with the collector of said first transistor and the emitter of said second transistor and to a common point in said circuit, a first and second driver transistor each including base, emitter, and collector electrodes, said first driver transistor being of an opposite conductivity type and said second driver transistor being of said one conductivity type, means connecting the collector and emitter of said first driver transistor with the base and collector respectively of said first output transistor, means connecting the emitter and collector of said second driver transistor with the base and collector respectively of said second output transistor, and means for applying an input signal between the base electrodes of said first and second driver transistors and said common point in said circuit.

3. A push-pull signal amplifier circuit comprising, in combination, a first and a second output transistor of one conductivity type each including base, emitter, and collector electrodes, means including a direct current supply source and the collector and emitter electrodes of each of said output transistors providing a series direct-current conductive path for applying energizing potentials to said output transistors, output circuit means connected with the collector of said first transistor and the emitter of said second transistor and to a common point in said circuit, a first and second driver transistor each including base, emitter, and collector electrodes, said first driver transistor being of an opposite conductivity type and said second driver transistor being of said one conductivity type, means connecting the collector and emitter of said first driver transistor with the base and collector respectively of said first output transistor, means connecting the emitter and collector of said second driver transistor with the base and collector respectively of said second output transistor, and means for applying an input signal between the base electrodes of said first and second driver transistors and said common point in said circuit.

4. A push-pull signal amplifier circuit comprising, in combination, a first and a second output transistor of one conductivity type each including base, emitter, and collector electrodes, means direct-current conductively connecting the emitter of said first transistor with the collector of said second transistor, output circuit means connected with the collector of said first transistor and the emitter of said second transistor and to a common point in said circuit, a first and second driver transistor each including base, emitter, and collector electrodes, said first driver transistor being of an opposite conductivity type and said second driver transistor being of said one conductivity type, means direct-current conductively connecting the collector of said first driver transistor with the base of said first output transistor, means direct-current conductively connecting the emitter of said second driver transistor with the base of said second output transistor, means providing a direct current supply source, means direct-current conductively connecting the collector electrodes of said second driver and second output transistors with said source, means including said output circuit means connecting the emitter of said first driver transistor and the collector of said first output transistor with said source, and means for applying an input signal between the base electrodes of said first and second driver transistors and said common point in said circuit.

5. A push-pull signal amplifier circuit comprising, in combination, a first and a second output transistor of one conductivity type each including base, emitter, and collector electrodes, means providing a source of direct energizing potential including a pair of terminals, means connecting the collector and emitter electrodes of each of said output transistors in series between the terminals of said source to provide a series direct current conductive path, the emitter of said first output transistor being connected to one of said terminals and the collector of said second output transistor being connected to the other of said terminals, said series direct current conductive path including a connection between the collector of said first output transistor and the emitter of said second output transistor, output terminal means connected with said connection and to a common point in said circuit, a first and second driver transistor each including base, emitter, and collector electrodes, said first driver transistor being of an opposite conductivity type and said second driver transistor being of said one conductivity type, means connecting the collector of said first driver transistor with the base of said first output transistor, means connecting the emitter of said second driver transistor with the base of said second output transistor, means direct-current conductively connecting the emitter of said first driver transistor with said output terminal means, means direct-current conductively connecting the collector of said second driver transistor with the other of said terminals of said potential source, and means for applying an input signal in parallel between the base electrodes of said first and second driver transistors and said common point in said circuit.

6. In a push-pull amplifier circuit, the combination comprising, a first pair of semiconductor devices of like conductivity type connected for push-pull operation and each including base, emitter, and collector electrodes, the emitter electrode of one device being connected to the collector electrode of the other device and the collector electrode of said one device being connected through a source of energizing potential to the emitter electrode of said other device, output circuit means connected with the emitter electrode of said one device and the collector electrode of said other of said devices and to a common point in said circuit, and push-pull driving means connected with the base electrodes of said devices, said push-pull driving means including a second pair of semiconductor devices each having base, emitter and collector electrodes, one of said devices of said second pair being of the same conductivity type as the devices of said first pair, the other of said devices of said second pair being of an opposite conductivity type, the emitter electrode of said one of said devices of said second pair being coupled with the base electrode of said one of said devices of said first pair, the collector electrode of said other of said devices of said second pair being connected to the base electrode of the other device of said first pair, means connecting the collector electrode of said one of said devices of said second pair with the collector electrode of said one of said devices of said first pair, means connecting the emitter electrode of said other of said devices of said second pair with the collector electrode of said other of said devices of said second pair, and input circuit means coupled with the base electrodes of said second pair of semiconductor devices and to said common point.

References Cited in the file of this patent

UNITED STATES PATENTS 2,431,973 White ---------------- Dec. 2, 1947

OTHER REFERENCES

Sziklai article, "Elec. Engineering," September 1953, pages 358–364. (Copy in 179–171–M.B.)

Sziklai: "Symmetrical Properties, etc.," proceedings of the I.R.E., June 1953, pages 717–724. (Copy in 171–179–M.B.)

"Power Transistors Circuit Design and Data," published March 1954, by Transistor Products, Inc., page 2. (Copy in 179–171–M.B.)